US012772388B2

(12) United States Patent
Hsu

(10) Patent No.: US 12,772,388 B2
(45) Date of Patent: Oct. 20, 2026

(54) PACKAGE CARRIER CORE LAYER STRUCTURE INTEGRATED WITH MAGNETIC ELEMENT STRUCTURE

(71) Applicant: Phoenix Pioneer Technology Co., Ltd., Hsinchu County (TW)

(72) Inventor: Shih-Ping Hsu, Hsinchu County (TW)

(73) Assignee: Phoenix Pioneer Technology Co., Ltd., Hsinchu County (TW)

( * ) Notice: Subject to any disclaimer, the term of this patent is extended or adjusted under 35 U.S.C. 154(b) by 516 days.

(21) Appl. No.: 18/184,005

(22) Filed: Mar. 15, 2023

(65) Prior Publication Data

US 2024/0215174 A1 Jun. 27, 2024

(30) Foreign Application Priority Data

Dec. 23, 2022 (TW) ................................. 111149707

(51) Int. Cl.
*H05K 3/46* (2006.01)
*H01F 17/00* (2006.01)
*H05K 1/16* (2006.01)
*H05K 3/42* (2006.01)

(52) U.S. Cl.
CPC ....... *H05K 3/4644* (2013.01); *H01F 17/0013* (2013.01); *H01F 17/0033* (2013.01); *H05K 1/165* (2013.01); *H05K 3/423* (2013.01); *H05K 2201/086* (2013.01)

(58) Field of Classification Search
CPC ...... H05K 3/4644; H05K 1/165; H05K 3/423; H05K 2201/086; H01F 17/0013; H01F 17/0033; H01F 41/046
See application file for complete search history.

(56) References Cited

U.S. PATENT DOCUMENTS 6,549,112 B1 * 4/2003 Gallina .................. H01F 5/003 336/200
9,854,671 B1 * 12/2017 Lin ........................ H05K 1/036
2013/0337268 A1 * 12/2013 Jeon .......................... C08J 5/18 523/435
2018/0061550 A1 * 3/2018 Lee ...................... H01F 17/0013
2022/0159839 A1 * 5/2022 Cho ...................... H05K 1/0298
2022/0191361 A1 * 6/2022 Dai ........................ H04N 23/55
2024/0177911 A1 * 5/2024 Kondo .................... C03C 3/064

* cited by examiner

*Primary Examiner* — Timothy J Thompson
*Assistant Examiner* — Aditya Sharma

(57) ABSTRACT

The invention provides a package carrier board and a manufacturing method thereof. The packaging carrier board includes a core layer, a magnetic element structure and a conductive connecting element. The core layer has a first surface and a second surface opposite to each other. The magnetic element structure includes a plurality of patterned magnetic conductive metal layers and a plurality of patterned conductive coil layers. The patterned magnetic conductive metal layers are stacked and embedded in the core layer, and each have at least one magnetic conductive metal, and part of these magnetic conductive metals form an array block. The patterned conductive coil layers are embedded in the core layer, and part of the patterned conductive coil layers are located on both sides of the array block. The conductive connecting element is arranged through the core layer and conducts the first surface and the second surface of the core layer.

12 Claims, 8 Drawing Sheets

PACKAGE CARRIER CORE LAYER STRUCTURE INTEGRATED WITH MAGNETIC ELEMENT STRUCTURE

CROSS REFERENCE TO RELATED APPLICATIONS

This Non-provisional application claims priority under 35 U.S.C. § 119(a) on Patent Application No. 111149707 filed in Taiwan, Republic of China on Dec. 23, 2022, the entire contents of which are hereby incorporated by reference.

BACKGROUND OF THE INVENTION

Field of the Invention

The present invention relates to a package carrier board and its manufacturing method, in particular, to a package carrier board integrated with the magnetic element structure and its manufacturing method.

Descriptions of the Related Art

In recent years, the functions required by electronic products have become more and more diversified, and the performance requirements have been continuously improved. Semiconductor IC packages, especially FCBGA packages, have integrated a large number of passive components in response to the high-function requirements of electronic products. Among the passive components, the inductor needs to occupy more space because of its large size and it is difficult to achieve thinning and miniaturization of the package.

Please refer to FIG. 1, a conventional solution is to directly penetrate and embed an inductor 120 in a core layer 110 of the package carrier board of FCBGA. Compared with the solution of directly installing the inductor on the core layer, this solution can slightly reduce the thickness of the package, however, if it wants to achieve better inductance and electrical performance, it will be limited by the structure of the inductor. Therefore, the inductor still cannot be shrunk enough to be completely embedded in the core layer and has a limited effect on thinning and miniaturization.

In addition, the electronic components of ICs used in cyber servers, high-speed computing, AI artificial intelligence, etc. need to integrate more chips with the demand for high functionality so that the FCBGA package is developed towards a large package size with a high stacking number (16L or 22L), high density, high I/O count, and high pin count. However, the problem encountered in large-size FCBGA packages is serious board warpage, which affects quality reliability and system assembly processing. In order to overcome the board warping problem, the conventional technology adopts a solution to increase the thickness of the core layer of the FCBGA package, for example, from 0.8 mm to 1.6 mm. Although the board warping is suppressed in this way, other problems arise, including:

(1) it is more difficult for the entire package to meet the miniaturization and thinning requirements of the semiconductor industry;

(2) it is difficult to achieve the fine pitch of the via hole due to the thicker thickness;

(3) the conduction resistance value becomes higher and the electrical property becomes worse due to the thicker thickness;

(4) the cooling effect is worsened due to thicker thickness;

(5) the processing cost of the via hole becomes higher as the core layer becomes thicker.

Consequently, it is an important subject of the invention to provide a package carrier board integrated with the magnetic element structure and manufacturing method thereof to solve the above problems.

SUMMARY OF THE INVENTION

In view of the foregoing, the invention is to provide a package carrier board, which can integrate magnetic components into the core layer so that the package carrier board can be thinned and miniaturized and the electrical performance of the magnetic components can be improved through the featured structure.

To achieve the above, a package carrier board of the invention includes a core layer, a magnetic element structure and a conductive connecting element. The core layer has an opposite first surface and a second surface, and each of the first surface and the second surface has a patterned conductive circuit layer. The magnetic element structure includes a plurality of patterned magnetic conductive metal layers and a plurality of patterned conductive coil layers. The patterned magnetic conductive metal layers are stacked at intervals and embedded in the core layer, and each has at least one magnetic conductive metal. Parts of the magnetic conductive metals form an array block. The patterned conductive coil layers are embedded in the core layer, and part of the patterned conductive coil layer is framed to surround the array block. The conductive connecting element is disposed through the core layer and electrically connects the first surface of the core layer and the patterned conductive circuit layer of the second surface.

In one embodiment, the package carrier board also includes a plurality of rigid support layers embedded in the core layer, which are disposed adjacent to the patterned conductive coil layers. In addition, at least one support member of the rigid support layer and at least one magnetic conductive metal element of the patterned magnetic conductive metal layer are support members or magnetic conductive metal elements in block shape, strip shape, or fin shape.

In one embodiment, the patterned magnetic conductive metal layer is made of iron (Fe), nickel (Ni), cobalt (Co), zinc (Zn), an alloy containing at least two (including more) of them, or in an alloy doped with manganese (Mn), molybdenum (Mo), boron (B), copper (Cu) or vanadium (V).

In one embodiment, the core layer is a plurality of insulating layers that are stacked, and its material includes organic photosensitive dielectric materials, organic non-photosensitive dielectric materials and/or inorganic oxide materials.

In one embodiment, the patterned conductive coil layers are helical coil-shaped inductive wiring, solenoid coil-shaped inductive wiring, or toroidal coil-shaped inductive wiring.

In one embodiment, the patterned conductive coil layer is made of copper, copper alloy, nickel, or silver.

In one embodiment, the material of the rigid support layer is copper (Cu), stainless steel, ceramics, plastic steel, iron (Fe), nickel (Ni), cobalt (Co), zinc (Zn), containing two or more alloys, or alloys doped with manganese (Mn), molybdenum (Mo), boron (B), copper (Cu), or vanadium (V).

In one embodiment, the package carrier board also includes a first circuit build-up layer structure and a second circuit build-up layer structure. The first circuit build-up layer structure is disposed on the first surface of the core layer and has a plurality of first insulating layers and a plurality of first conductive circuit layers. The first conductive circuit layers are stacked and covered by the first insulating layers. The second circuit build-up layer structure is disposed on the second surface of the core layer and has a plurality of second insulating layers and a plurality of second conductive circuit layers. The second conductive circuit layers are stacked and covered by the second insulating layers.

In one embodiment, another magnetic element structure is embedded in the first circuit build-up layer structure and/or the second circuit build-up layer structure.

To achieve the above, a manufacturing method of a package carrier board of the invention includes the following steps. Firstly, an upper surface of an insulating layer is respectively electroplated to form a patterned magnetic conductive metal layer and a patterned conductive coil layer adjacent to each other. Then another insulating layer is formed to cover the patterned magnetic conductive metal layer and the patterned conductive coil layer, and the above steps are repeated. The insulating layers formed after the above-repeated steps constitute a core layer, and the patterned magnetic conductive metal layers and the patterned conductive coil layers constitute a magnetic element structure. Then a plurality of conductive connecting elements is formed on the core layer to electrically connect a first surface and a second surface of the core layer. Then, a patterned conductive circuit layer is formed on the first surface and the second surface of the core layer, respectively, to electrically connect the conductive connecting element.

In one embodiment, the manufacturing method of the package carrier board further includes forming a first circuit build-up layer structure on the first surface of the core layer and forming a second circuit build-up layer structure on the second surface of the core layer.

In one embodiment, the formation of the first circuit build-up layer structure and the second circuit build-up layer structure adopts Semi-additive Process.

In one embodiment, the step of forming the conductive connecting element also includes forming a through hole in the core layer and forming a conductive pillar in the through hole by electroplating.

In one embodiment, the manufacturing method of the package carrier board also includes electroplating a rigid support layer to the upper surface of the insulating layer. Among them, the rigid support layer can be electroplated together with the patterned magnetic conductive metal layer or made in stages.

The detailed technology and preferred embodiments implemented for the subject invention are described in the following paragraphs accompanying the appended drawings for people skilled in this field to well appreciate the features of the claimed invention.

BRIEF DESCRIPTION OF THE DRAWINGS

The parts in the drawings are not necessarily drawn to scale, the emphasis instead being placed upon clearly illustrating the principles of at least one embodiment. In the drawings, like reference numerals designate corresponding parts throughout the various diagrams, and all the diagrams are schematic.

DESCRIPTION OF THE PREFERRED EMBODIMENT

In the following description, this invention will be explained with reference to embodiments thereof. However, the description of these embodiments is only for purposes of illustration rather than limitation.

Figure 1:
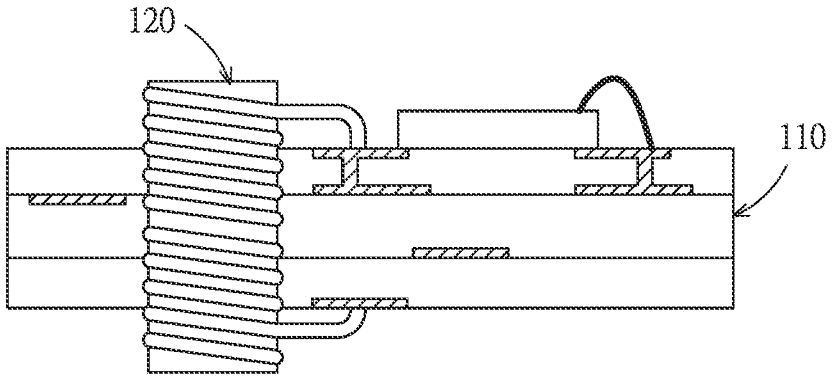
FIG. 1 (prior art)
FIG. 1 is a schematic illustration showing a cross-sectional view of a conventional FCBGA package carrier board.
Figure 2:
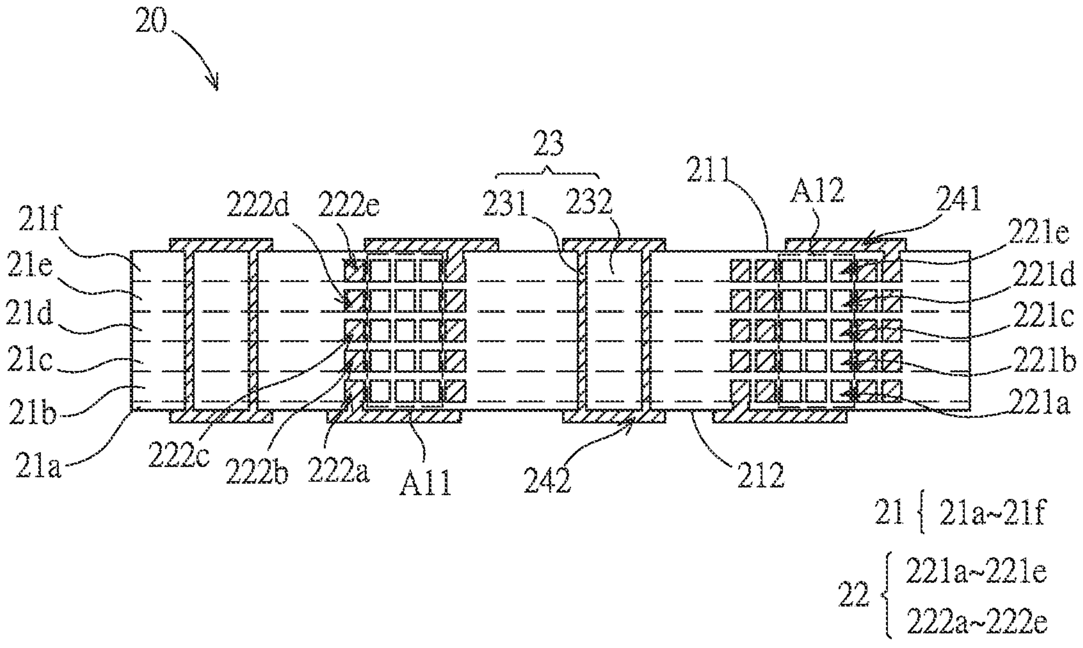
FIG. 2 is a schematic illustration showing a cross-sectional view of a package carrier board according to the first embodiment of the invention.

FIG. 2 is a schematic illustration showing a cross-sectional view of a package carrier board 20 according to the first embodiment of the present invention. The package carrier board 20 includes a core layer 21, a magnetic element structure 22, and a conductive connecting element 23. The package carrier board 20 of the embodiment takes the package carrier board of an FCBGA as an example, which is a high-density semiconductor package carrier board that realizes high-speed and multi-functional of large-scale integrated circuits. The magnetic element structure 22 takes the inductor as an example, which can be a spiral inductor, a solenoid inductor, a toroidal inductor, or a combination thereof. In other embodiments, the magnetic element structure 22 can also be a transformer. The embodiment of the present invention is illustrated by taking the spiral inductor as an example.

The core layer 21 includes a plurality of insulating layers 21*a*-21*f*, which are formed by stacking each other and have a first surface 211 and a second surface 212 opposite to each other. The materials of the insulating layers 21*a*-21*f* may include organic photosensitive dielectric materials or organic non-photosensitive dielectric materials, such as insulating materials containing glass fibers or organic resins. Among them, organic resins include but are not limited to BT, FR4, or FR5 substrates or prepreg epoxy resins, organic substrates ABF (Ajinomoto Build-up Film), epoxy molding compound (EMC), filmed EMC, or polyimide (PI). The materials of part of the insulating layers 21*a*-21*f* may also include the inorganic oxide materials with micron or nanometer scale, such as silicon oxide (SiOx), nickel oxide (NiO), or copper oxide. In other embodiments, the insulating layers 21*a*-21*f* can be composed of the same or different materials.

The magnetic element structure 22 is embedded in the core layer 21 and includes a plurality of patterned magnetic conductive metal layers 221*a*-221*e* and a plurality of patterned conductive coil layers 222*a*-222*e*. The patterned magnetic conductive metal layers 221*a*-221*e* are stacked and embedded in the core layer 21. The patterned conductive coil layers 222*a*-222*e* are also stacked and embedded in the core layer 21. Between the patterned magnetic conductive metal layers 221*a*-221*e* and between the patterned conductive coil layers 222*a*-222*e* are partitioned by the corresponding insulating layers 21*a*-21*f*.

Figure 3:
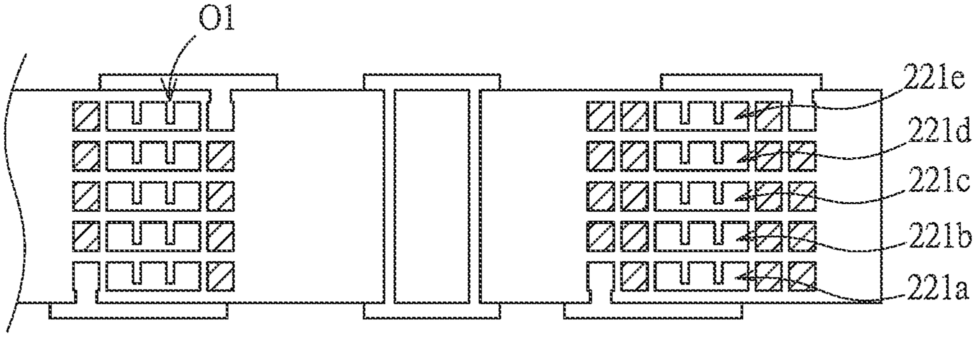
FIG. 3 is a schematic illustration showing that the magnetic conductive metal part of the patterned magnetic conductive metal layer in the first embodiment is fin-shaped.

Each patterned magnetic conductive metal layer 221*a*-221*e* has at least one magnetic conductive metal element respectively, and a part of the magnetic conductive metal elements constitutes an array block. In the embodiment, the magnetic conductive metal elements constitute a first array block A11 and a second array block A12. The number and range of the magnetic conductive metal elements included in the first array block A11 and the second array block A12 are not limited. The magnetic conductive metal elements of the patterned magnetic conductive metal layers 221*a*-221*e* can be in the form of blocks (as shown in FIG. 2), fins (as shown in FIG. 3), or strips (not shown in the figure), etc., is not limited here. It should be noted that the opening O1 of the fin-shaped magnetic conductive metal element shown in FIG. 3 is facing upwards, in other embodiments, the opening of the fin-shaped magnetic conductive metal element can also face downward or have a combination of both.

Part of the conductive coils in each patterned conductive coil layer 222*a*-222*e* are located on both sides of the first array block A11 and part of the conductive coils are located on both sides of the second array block A12. The winding of the conductive coil can be a single-layer or multiple-layer winding coil, and the winding of the conductive coil can also be adjusted to be arranged at the upper and lower outermost positions of the first array block A11 or the second array block A12 to form the toroidal inductor or the solenoid inductor, which is not limited here. In other words, the patterned conductive coil layers 222*a*~222*e* can constitute helical coil-shaped inductive wiring, solenoid coil-shaped inductive wiring, or toroidal coil-shaped inductive wiring.

The material of the patterned magnetic conductive metal layers 221*a*~221*e* includes but not limited to iron (Fe), nickel (Ni), cobalt (Co), zinc (Zn), an alloy containing at least two (including more) of them, or in an alloy doped with manganese (Mn), molybdenum (Mo), boron (B), copper (Cu) or vanadium (V). The material of the patterned conductive coil layers 222*a*-222*e* includes but not limited to copper, copper alloy, nickel, or silver (Ag).

The conductive connecting element 23 is arranged through the core layer 21 and conducts the first surface 211 and the second surface 212 of the core layer 21. The so-called "conducts the first surface 211 and the second surface 212" refers to electrically connecting the wires or circuits provided on the first surface 211 and the second surface 212, and can also be widely interpreted as electrically connecting wires or circuits between different layers. In the embodiment, the conductive connecting element 23 is for conducting the patterned conductive circuit layer 241 disposed on the first surface 211 and the patterned conductive circuit layer 242 disposed on the second surface 212. The conductive connecting element 23 can be formed by mechanically drilling or laser drilling the core layer 21 to form the electroplated via 231 and then filling the plugging resin 232 to form, alternatively, the through hole is formed in the core layer 21 and then the conductive pillars are plated, which is not limited here.

Figure 4:
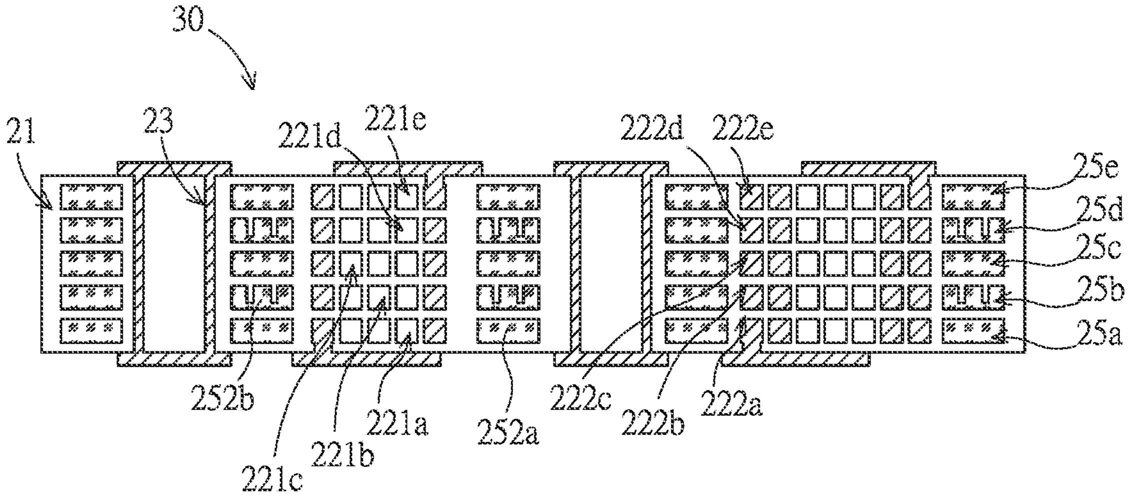
FIG. 4 is a schematic illustration showing a cross-sectional view of a package carrier board according to the second embodiment of the invention.

FIG. 4 is a schematic illustration showing a cross-sectional view of a package carrier board according to the second embodiment of the invention. The difference from the first embodiment, the package carrier board 30 also includes a plurality of rigid support layers 25*a*-25*e*. The rigid support layers 25*a*-25*e* are embedded in the core layer 21 and adjacent to the patterned conductive coil layers 222*a*-222*e*. Each rigid support layer 25*a*-25*e* also includes at least one support member, which can be in the form of blocks, strips, or fins according to requirements. Among them, the strip-shaped support member is, for example, the support member 252*a* and the fin-shaped support member is, for example, the support member 252*b*. In other words, the support member of the rigid support layer 25*a*-25*e* can be disposed between the conductive connecting element 23 and the patterned conductive coil layer 222*a*-222*e*.

The material of the rigid support layers 25*a*~25*e* includes but is not limited to copper, stainless steel, ceramics, plastic steel, iron, nickel, cobalt, zinc, or alloys containing at least two (including more) of them, or alloys doped with manganese and molybdenum, boron, copper, or vanadium and other materials. Through the rigid support layers 25*a*-25*e*, the package carrier board 30 can be provided with sufficient rigidity to avoid board warpage, especially when the package carrier board 30 is of large size or panel level.

The above-mentioned magnetic conductive metal elements of the patterned magnetic conductive metal layer 221*a*-221*e* and the support member of the rigid support layers 25*a*-25*e* can be designed as blocks, strips, sheets, fins, or combinations thereof according to requirements (such as support, electrical characteristics, or size requirements), which are not limited.

Figure 5A:
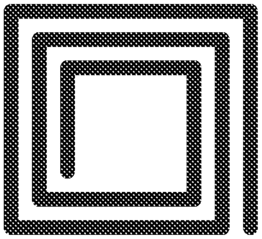
FIGS. 5A to 5C are schematic illustrations showing the implementations of the patterned conductive coil layer observed from a top view.
Figure 5B:
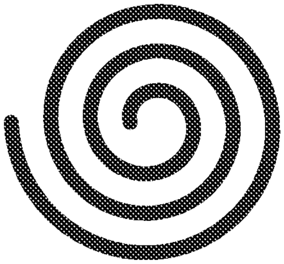
Figure 5C:
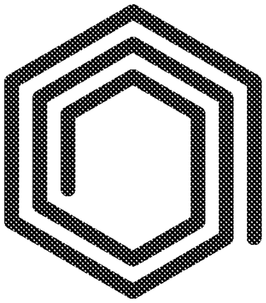

The patterns formed by the above-mentioned patterned conductive coil layers 222*a*~222*e* can also have various implementations. For example, when viewed from the top of the first surface 211 of the core layer 21, the patterned conductive coil layer can be rectangular as shown in FIG. 5A, circular as shown in FIG. 5B, polygonal as shown in FIG. 5C, and elliptical (not shown in the figure), are not limited here.

Figure 6:
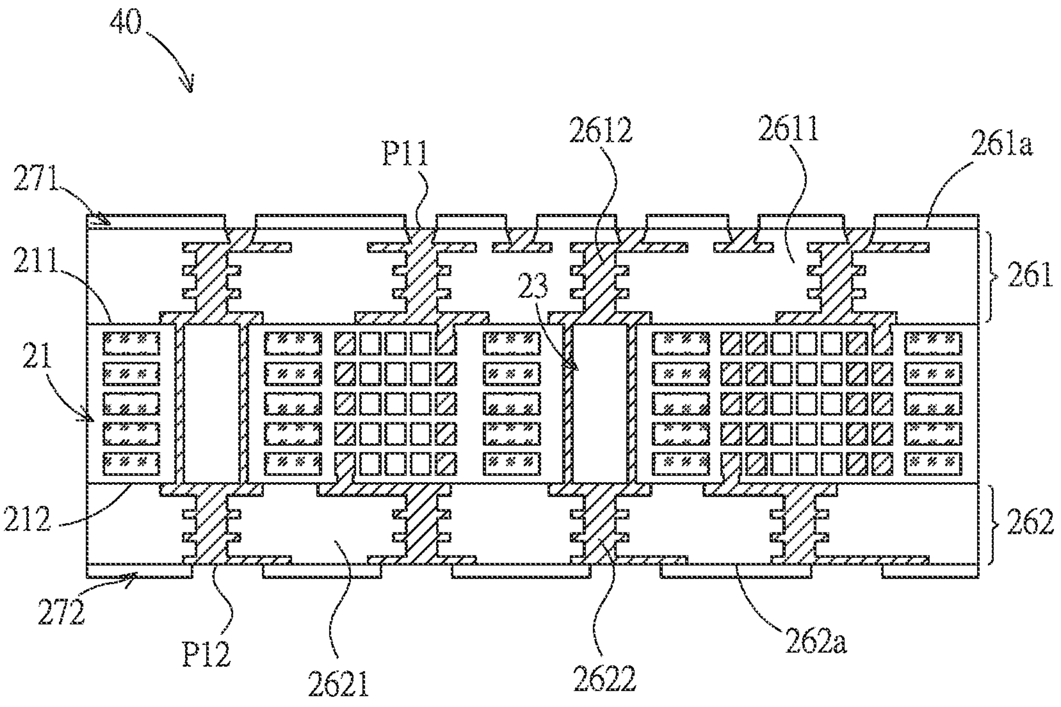
FIG. 6 is a schematic illustration showing a cross-sectional view of a package carrier board according to the third embodiment of the invention.

FIG. 6 is a schematic illustration showing a cross-sectional view of a package carrier board according to the third embodiment of the invention. The difference from the second embodiment, the package carrier board 40 also includes a first circuit build-up layer structure 261 and a second circuit build-up layer structure 262. The first circuit build-up layer structure 261 is located on the first surface 211 of the core layer 21 and the second circuit build-up layer structure 262 is located on the second surface 212 of the core layer 21.

The first circuit build-up layer structure 261 includes a plurality of first insulating layers 2611 and a plurality of first conductive circuit layers 2612. The first conductive circuit layers 2612 are stacked and can be electrically connected with the conductive connecting element 23 and the magnetic element structure 22. The first insulating layers 2611 cover the first conductive circuit layers 2612, wherein a surface 261*a* on the outermost side of the first insulating layer 2611 exposes part of the first conductive circuit layer 2612 to form the electrode pad P11. A first insulating protecting layer 271 is also disposed on the surface 261*a*.

The second circuit build-up layer structure 262 includes a plurality of second insulating layers 2621 and a plurality of second conductive circuit layers 2622. The second conductive circuit layers 2622 are stacked and can be electrically connected with the conductive connecting element 23 and the magnetic element structure 22. The second insulating layers 2621 cover the second conductive circuit layers 2622, wherein a surface 262*a* on the outermost side of the second insulating layer 2621 exposes part of the second conductive circuit layer 2622 to form the electrode pad P12. A second insulating protecting layer 272 is also disposed on the surface 262*a*.

Figure 7:
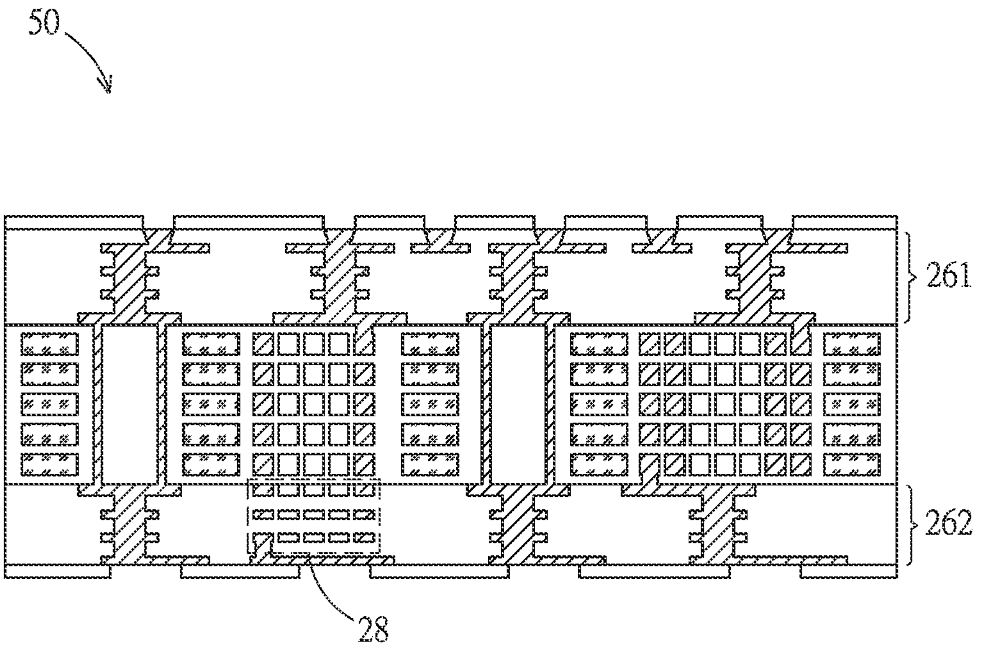
FIG. 7 is a schematic illustration showing a cross-sectional view of a package carrier board according to the fourth embodiment of the invention.

FIG. 7 is a schematic illustration showing a cross-sectional view of a package carrier board according to the fourth embodiment of the invention. The difference from the third embodiment, another magnetic element structure 28 can be embedded in the second circuit build-up layer structure 262 of the package carrier board 50. The magnetic element structure 28 and the above-mentioned magnetic element structure 22 May have a similar structure and implementation and will not be repeated. In other embodiments, the magnetic element structure 28 May also be embedded in the first circuit build-up layer structure 261, or embedded in both, which is not limited.

Figure 8:
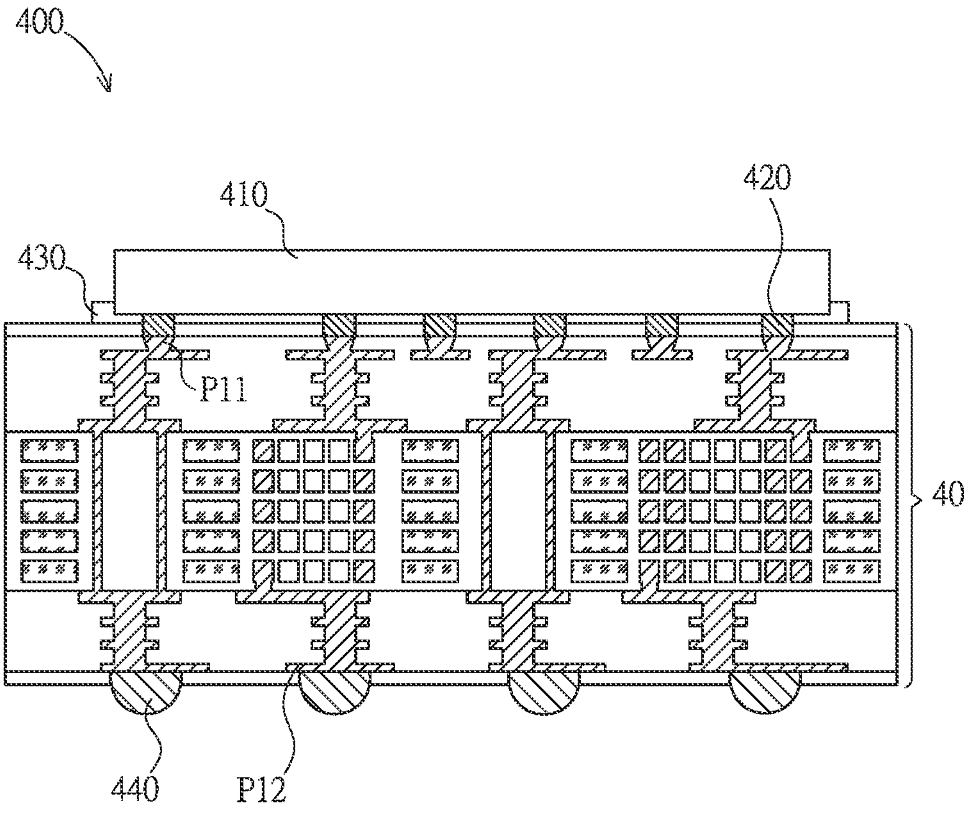
FIG. 8 is a schematic illustration showing a cross-sectional view of the package structure formed by the package carrier board of the invention.

FIG. 8 shows the package structure 400 formed by using the package carrier board 40 of the above-mentioned third embodiment. A chip 410 is electrically connected to the electrode pad P11 through a plurality of conductive bumps 420. In other embodiments, the conductive bump 420 can also be conductive glue or other components with connection and conduction functions. A filling element 430 such as insulating glue or epoxy resin may also be provided below the chip 410, that is, between the chip 410 and the package carrier board 40, to increase the mechanical strength of the connection point. In addition, the package structure 400 also includes a plurality of electrically connecting elements 440, which are arranged and electrically connected to the electrode pad P12 of the package carrier board 40. The electrically connecting element 440 is for example but not limited to solder balls, conductive bumps, or conductive pins.

Next, in conjunction with related drawings and taking the package carrier board 50 as an example, the manufacturing method of the package carrier board of the present invention is described, which includes steps S11-S18.

Figure 9A:
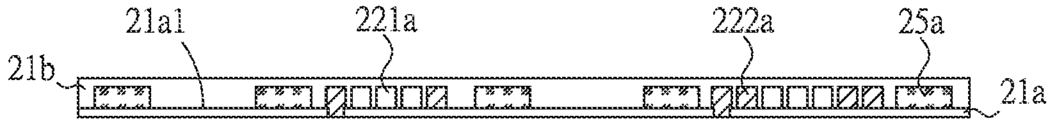
FIGS. 9A to 9D are schematic illustrations showing corresponding structures of a manufacturing method of the package carrier board according to a preferred embodiment of the invention.

As shown in FIG. 9A, step S11 is to form a patterned magnetic conductive metal layer 221*a* and a rigid support layer 25*a* by electroplating on an upper surface 21*a*1 of an insulating layer 21*a*. Step S12 is to electroplate to form a patterned conductive coil layer 222*a* on the upper surface 21*a*1 of the insulating layer 21*a*. Step S13 is to form an insulating layer 21*b* to cover the patterned magnetic conductive metal layer 221*a* and the patterned conductive coil layer 222*a*.

The above-mentioned patterned magnetic conductive metal layer 221*a*, the rigid support layer 25*a* and the patterned conductive coil layer 222*a* each have different material compositions, which can be electroplated to form specific materials by controlling and adjusting electroplating conditions according to different materials. The materials thereof have been respectively described in the above-mentioned embodiments and will not be repeated.

The organic material layer of the insulating layer can be formed by vacuum lamination, hot press coating and printing, etc., and the inorganic oxide can be formed by sputtering, chemical vapor deposition (CVD), physical vapor deposition (PVD), or electroplating.

The above-mentioned patterned magnetic conductive metal layer 221*a* and the rigid support layer 25*a* are made of the same material as an example, so they can be formed simultaneously in the same step, and when different materials are required by the design, they can also be formed in different steps.

Figure 9B:
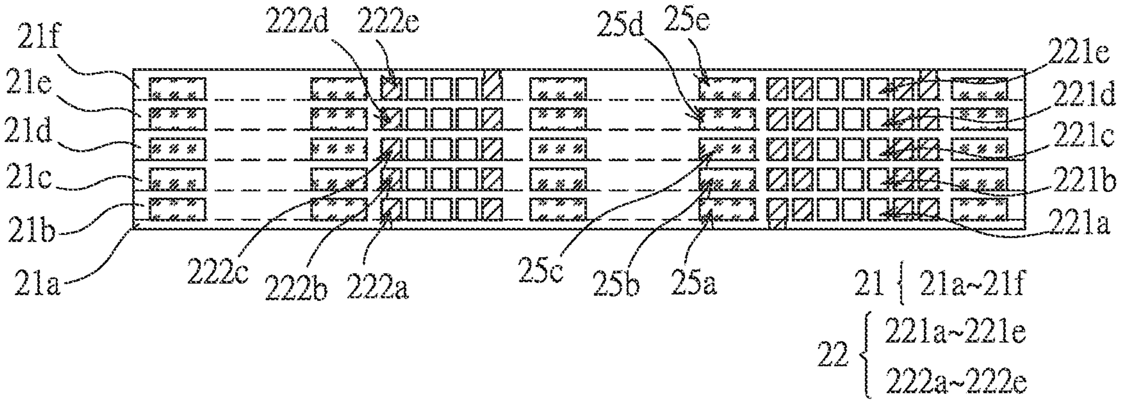

Then repeat the above steps S11 to S13 to complete the patterned magnetic conductive metal layers 221*b*-221*e*, the rigid support layers 25*a*-25*e*, the patterned conductive coil layers 222*b*-222*e*, and the insulating layers 21*c*-21*f* as shown in FIG. 9B. Among them, the insulating layers 21*a*-21*f* constitute the core layer 21, the patterned magnetic conductive metal layers 221*a*-221*e* and the patterned conductive coil layers 222*a*-222*e* constitute the magnetic element structure 22.

It should be noted that the above steps S11 to S13 are described by taking the single-sided process as an example, and in other embodiments, it can also be a double-sided process. That is, the patterned magnetic conductive metal layer and the patterned conductive coil layer can also be formed on a bottom surface of the insulating layer.

Figure 9C:
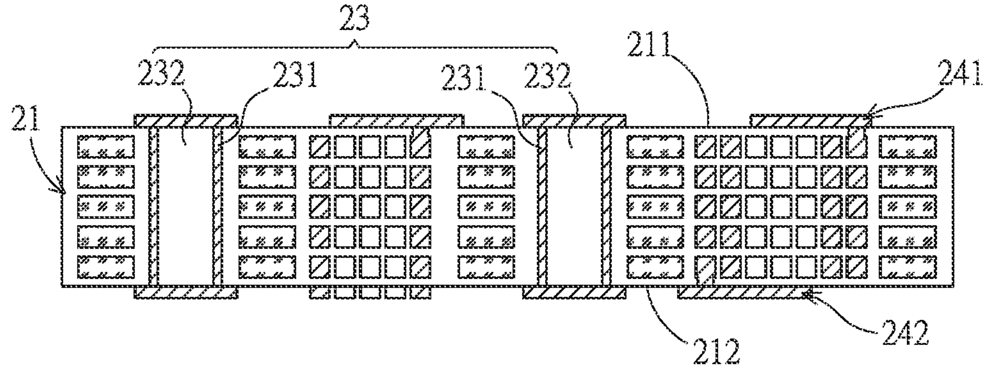

As shown in FIG. 9C, step S14 is to form the electroplated via 231 on the core layer 21. Step S15 is to fill a plugging resin 232 in the electroplated via 231 to form the conductive connecting element 23. The above-mentioned electroplated via 231 can be formed by mechanical drilling or laser drilling through holes in the core layer 21 and then electroplating metal on the walls of the through holes. It should be noted that, in other embodiments, the conductive connecting element 23 can also be formed by electroplating in the through hole to form a conductive pillar after the core layer 21 forms a through hole.

Next, step S16 is to form the patterned conductive circuit layer 241 on the first surface 211 of the core layer 21 and form the patterned conductive circuit layer 242 on the second surface 212 of the core layer 21. Among them, the patterned conductive circuit layer 241 and the patterned conductive circuit layer 242 can be formed separately or simultaneously, which is not limited.

Figure 9D:
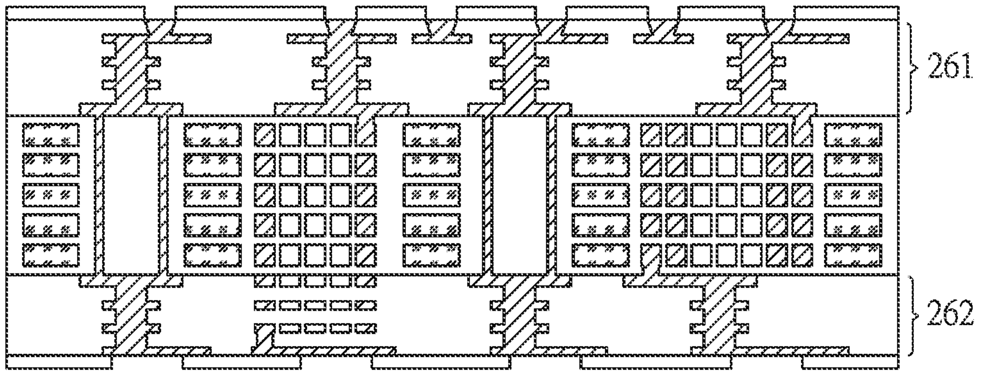

Next, as shown in FIG. 9D, step S17 is to form a first circuit build-up layer structure 261 on the first surface 211 of the core layer 21. Step S18 is to form a second circuit build-up layer structure 262 on the second surface 212 of the core layer 21. In the embodiment, the first circuit build-up layer structure 261 and the second circuit build-up layer structure 262 can be made by Semi-additive Process (SAP). It is should be noted that the process sequence of the first circuit build-up layer structure 261 and the second circuit build-up layer structure 262 can be completed the first circuit build-up layer structure 261 before completing the second circuit build-up layer structure 262. In other embodiment, the double-sided process can also be used to make the two processes simultaneously, which is not limited.

In summary, the package carrier board and manufacturing method thereof of the present invention integrate the magnetic element structure into the core layer of the package carrier board. Among them, the magnetic element structure is formed by the patterned magnetic conductive metal layer and the patterned conductive coil layer, and the magnetic conductive metal in the patterned magnetic conductive metal layer is block-shaped, strip-shaped, or fin-shaped as a magnetic core to achieve lower magnetic loss, lower impedance, smaller parasitic capacitance, and lower eddy current effect to obtain higher inductance value and better quality factor thereby reducing energy consumption of magnetic components and improving performance to achieve good electrical characteristics, it is also possible to further reduce the size of the package structure and is suitable for thin and miniaturized designs.

The above embodiments merely give the detailed technical contents of the present invention and inventive features thereof and are not to limit the covered range of the present invention. People skilled in this field may proceed with a variety of modifications and replacements based on the disclosures and suggestions of the invention as described without departing from the characteristics thereof. Nevertheless, although such modifications and replacements are not fully disclosed in the above descriptions, they have substantially been covered in the following claims as appended.

What is claimed is:

1. A package carrier core layer structure integrated with a magnetic element structure, comprising:
 a core layer, which has an opposite first surface and a second surface, and each of the first surface and the second surface has a patterned conductive circuit layer;
 a magnetic element structure, comprising:
  a plurality of patterned magnetic conductive metal layers, which are stacked at intervals and embedded in the core layer, and each has at least one magnetic conductive metal;
  a plurality of patterned conductive coil layers, which are embedded in the core layer, wherein the plurality of patterned conductive coil layers are vertically stacked and connected to form a vertical solenoid-like inductive coil, and each layer of the plurality of patterned conductive coil layers is individually framed to surround a corresponding layer of the plurality of patterned magnetic conductive metal layers; and
 a conductive connecting element, which is disposed through the core layer and electrically connects the first surface of the core layer and the patterned conductive circuit layer of the second surface.

2. The package carrier core layer structure integrated with a magnetic element structure of claim 1, wherein each patterned magnetic conductive metal layer has a plurality of magnetic conductive metal elements in block shape, strip shape, or fin shape.

3. The package carrier core layer structure integrated with a magnetic element structure of claim 1, wherein the patterned magnetic conductive metal layer is made of iron (Fe), nickel (Ni), cobalt (Co), zinc (Zn), an alloy containing at least two of them or more, or in an alloy doped with manganese (Mn), molybdenum (Mo), boron (B), copper (Cu) or vanadium (V).

4. The package carrier core layer structure integrated with a magnetic element structure of claim 1, wherein the core layer is a plurality of insulating layers that are stacked, and its material includes organic photosensitive dielectric materials, organic non-photosensitive dielectric materials and/or inorganic oxide materials.

5. The package carrier core layer structure integrated with a magnetic element structure of claim 1, wherein the patterned conductive coil layer is made of copper, copper alloy, nickel, or silver.

6. The package carrier core layer structure integrated with a magnetic element structure of claim 1, further comprising:
 a plurality of rigid support layers, which is embedded in the core layer and adjacent to the patterned conductive coil layers.

7. The package carrier core layer structure integrated with a magnetic element structure of claim 6, wherein each rigid support layer has a plurality of support members in block shape, strip shape, or fin shape.

8. The package carrier core layer structure integrated with a magnetic element structure of claim 6, wherein the material of the rigid support layer is copper (Cu), stainless steel, ceramics, plastic steel, iron (Fe), nickel (Ni), cobalt (Co), zinc (Zn), containing two or more alloys, or alloys doped with manganese (Mn), molybdenum (Mo), boron (B), copper (Cu), or vanadium (V).

9. The package carrier core layer structure integrated with a magnetic element structure of claim 6, further comprising:
 a first circuit build-up layer structure, which is disposed on the first surface of the core layer and has a plurality of first insulating layers and a plurality of first conductive circuit layers, wherein the first conductive circuit layers are stacked and covered in the first insulating layer; and
 a second circuit build-up layer structure, which is disposed on the second surface of the core layer and has a plurality of second insulating layers and a plurality of second conductive circuit layers, wherein the second conductive circuit layers are stacked and covered in the second insulating layer.

10. The package carrier core layer structure integrated with a magnetic element structure of claim 9, wherein another magnetic element structure is embedded in the first circuit build-up layer structure and/or the second circuit build-up layer structure.

11. The package carrier core layer structure integrated with a magnetic element structure of claim 1, further comprising:
 a first circuit build-up layer structure, which is disposed on the first surface of the core layer and has a plurality of first insulating layers and a plurality of first conductive circuit layers, wherein the first conductive circuit layers are stacked and covered in the first insulating layer; and
 a second circuit build-up layer structure, which is disposed on the second surface of the core layer and has a plurality of second insulating layers and a plurality of second conductive circuit layers, wherein the second conductive circuit layers are stacked and covered in the second insulating layer.

12. The package carrier core layer structure integrated with a magnetic element structure of claim 11, wherein another magnetic element structure is embedded in the first circuit build-up layer structure and/or the second circuit build-up layer structure.

* * * * *